United States Patent
Ando et al.

(10) Patent No.: US 7,372,027 B2
(45) Date of Patent: May 13, 2008

(54) ELECTRON BEAM APPARATUS AND METHOD FOR MANUFACTURING SEMICONDUCTOR DEVICE

(75) Inventors: Atsushi Ando, Tokyo (JP); Katsuhide Watanabe, Fujisawa (JP)

(73) Assignee: Tokyo Electron Limited, Tokyo (JP)

( * ) Notice: Subject to any disclaimer, the term of this patent is extended or adjusted under 35 U.S.C. 154(b) by 246 days.

(21) Appl. No.: 11/247,263

(22) Filed: Oct. 12, 2005

(65) Prior Publication Data

US 2006/0097165 A1 May 11, 2006

(30) Foreign Application Priority Data

Oct. 15, 2004 (JP) ............... 2004-301714

(51) Int. Cl.
*G01N 23/00* (2006.01)
(52) U.S. Cl. ............ 250/310; 250/307; 250/441.11; 250/442.11
(58) Field of Classification Search ........... 250/310
See application file for complete search history.

(56) References Cited

U.S. PATENT DOCUMENTS

| 3,636,346 | A * | 1/1972 | Akahori et al. ............ 313/443 |
| 6,653,629 | B2 | 11/2003 | Tanaka et al. |
| 2002/0038852 | A1 | 4/2002 | Suzuki |
| 2003/0201391 | A1 * | 10/2003 | Shinada et al. ............ 250/307 |

FOREIGN PATENT DOCUMENTS

| JP | 2-65044 | 3/1990 |
| JP | 2004-2993504 | 10/1999 |

OTHER PUBLICATIONS

Official Action issued by the German Patent Office on Apr. 25, 2007, for German Patent Application No. 10 2005 049 066.2-54, and English-language translation thereof.

* cited by examiner

*Primary Examiner*—Jack Berman
*Assistant Examiner*—Andrew Smyth
(74) *Attorney, Agent, or Firm*—Finnegan, Henderson, Farabow, Garrett & Dunner, L.L.P.

(57) ABSTRACT

A sample chamber and a column are connected to each other and comprise a magnetic substance. An exhaust section controls a pressure in the sample chamber and the column. A stage controller controls a stage, above which a sample is placed, in the sample chamber. An electron beam source power supply supplies power to an electron beam source, which emits an electron beam to the sample. A power supply supplies voltage to electron optic system, which controls the electron beam. The sample chamber, exhaust section, stage controller, electron beam source power supply and power supply are grounded by a first, second, third, fourth and fifth grounding point, respectively. The electron beam source and the electron optic system are electrically insulated from the sample chamber, column, exhaust section and stage. One of the first, second and third grounding point is different from the fourth or fifth grounding point.

16 Claims, 7 Drawing Sheets

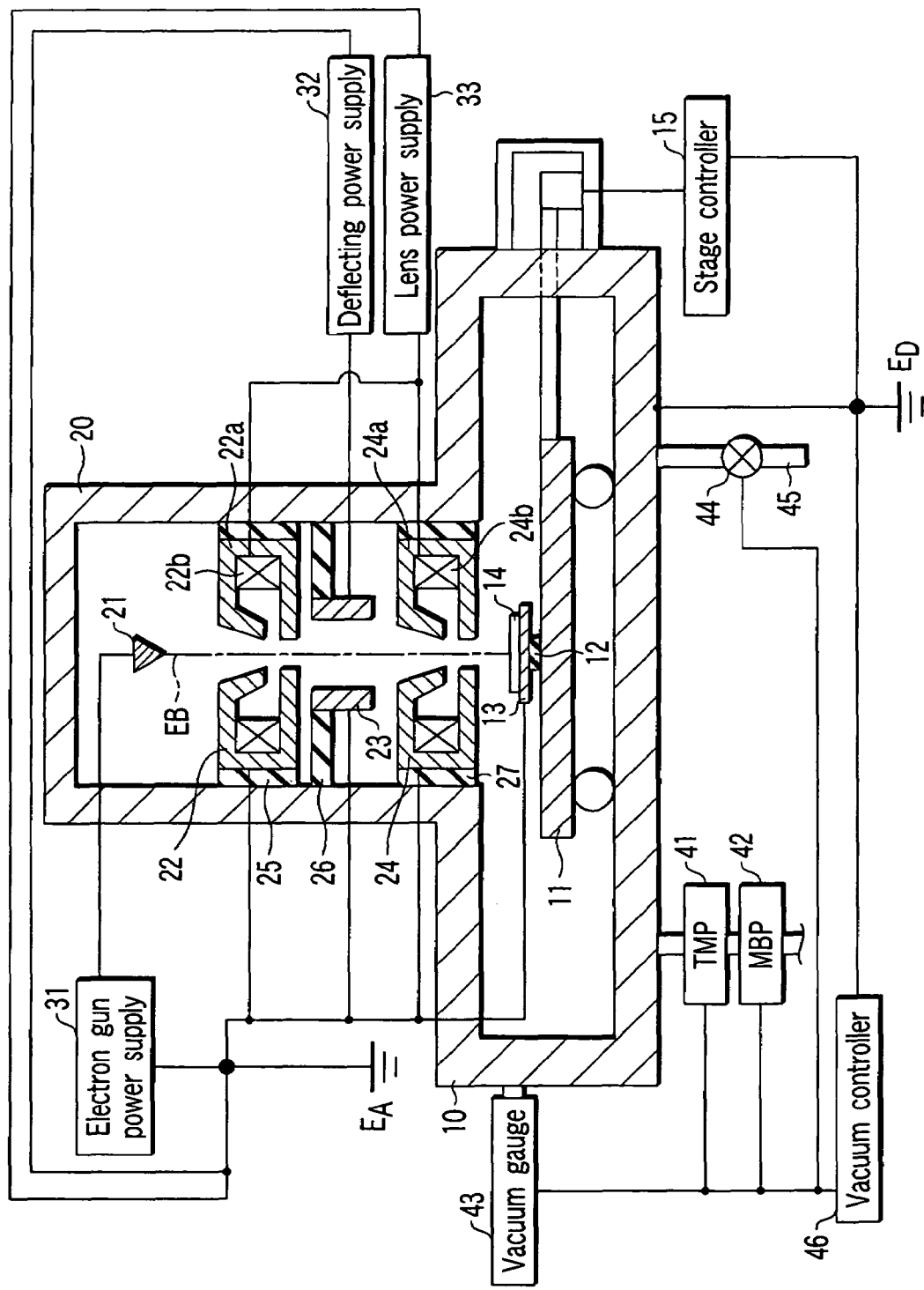
F I G. 1

ELECTRON BEAM APPARATUS AND METHOD FOR MANUFACTURING SEMICONDUCTOR DEVICE

CROSS-REFERENCE TO RELATED APPLICATIONS

This application is based upon and claims the benefit of priority from prior Japanese Patent Application No. 2004-301714, filed Oct. 15, 2004, the entire contents of which are incorporated herein by reference.

BACKGROUND OF THE INVENTION

1. Field of the Invention

The present invention relates to an electronic beam apparatus and a method for manufacturing a semiconductor device using the electron beam apparatus, and more specifically, to the configuration of a vacuum container and column for an electronic beam apparatus.

2. Description of the Related Art

An apparatus using an electron beam can achieve a higher resolution than an apparatus using light, owing to the small wavelength of an electron beam. Thus, the electron beam is used for a transmission electron microscope, a scanning electron microscope, an electron beam drawing apparatus, and the like. The electron beam is composed of charged particles and is thus controlled by electromagnetic fields. However, a grounding environment may disturb the electromagnetic fields to affect the electron beam. This may make it difficult to control the electron beam. That is, the precision of control of the electron beam may be degraded. To avoid this, a vacuum chamber and a column are made of a magnetic substance having a lower magnetic resistance than the atmosphere, for example, iron; the vacuum chamber stores a sample and the column stores an objective and a condensing lens (Japanese Patent No. 2,993,504). This configuration attracts the magnetic disturbance into the chamber and column. Then, magnetic flux from a magnetic disturbance pass through the chamber and column and are thus prevented from affecting the electron beam.

Magnetic Problem

As described above, the chamber and column are made of the magnetic substance. Thus, when the magnetic disturbance reaches the chamber, a magnetic flux resulting from the magnetic disturbance flows through the magnetic substance constituting the chamber and then toward the column. The column is electromagnetically joined to the objective and condensing lens. Thus, the magnetic flux from the column passes through magnetic poles of the objective and condensing lens. The magnetic flux then seeps from gaps in the lenses. The magnetic flux may degrade the control of the electron beam EB.

Electric Noise Problem

The chamber connects to a pump for vacuum pumping, an measuring instrument for the degree of vacuum, a stage controller, pipe and solenoid valve which sets the pressure in the chamber equal to atmospheric pressure. Further, a solenoid valve for valve control is attached to vacuum pipe. These electric apparatuses make electric noise. The electric noise may vary the reference potentials of power supplies that control the chamber, column, and beam. This degrades the ability to control the electron beam.

BRIEF SUMMARY OF THE INVENTION

According to a first aspect of the present invention, there is provided an electron beam apparatus comprising: a sample chamber grounded by a first grounding point and comprising a magnetic substance; a column connected to the sample chamber and comprising a magnetic substance; an exhaust section controlling a pressure in the sample chamber and a pressure in the column and grounded by a second grounding point; a stage provided in the sample chamber, a sample being placed above the stage; a stage controller driving the stage and grounded by a third grounding point; an electron beam source provided in the column and emitting an electron beam to the sample; an electron beam source power supply supplying power to the electron beam source and grounded by a fourth grounding point; and electron optic system provided in the column and controlling the electron beam; a power supply supplying voltage to the electron optic system and grounded by a fifth grounding point; wherein the electron beam source and the electron optic system are electrically insulated from the sample chamber, the column, the exhaust section and the stage, and a grounding point selected from a group including the first grounding point, the second grounding point and the third grounding point is different from either the fourth grounding point or the fifth grounding point.

According to a second aspect of the present invention, there is provided an electron beam apparatus comprising: a sample chamber; a column connected to the sample chamber; an exhaust section which controls a pressure in the sample chamber and the column; a stage stored in the sample chamber, a sample being placed above the stage; a stage controller driving the stage; a cylinder provided in the column and electrically insulated from the column; an electron beam source provided in the cylinder and emitting an electron beam to the sample; an electron beam source power supply supplying power to the electron beam source; electron optic system provided in the cylinder and controlling the electron beam; and a power supply supplying a voltage to the electron optic system.

According to a third aspect of the present invention, there is provided a method for manufacturing a semiconductor device, the method comprising drawing a pattern on film located above a semiconductor substrate using an electron beam apparatus comprising: a sample chamber grounded by a first grounding point and comprising a magnetic substance; a column connected to the sample chamber and comprising a magnetic substance; an exhaust section controlling a pressure in the sample chamber and a pressure in the column and grounded by a second grounding point; a stage provided in the sample chamber, a sample being placed above the stage; a stage controller driving the stage and grounded by a third grounding point; an electron beam source provided in the column and emitting an electron beam to the sample; an electron beam source power supply supplying power to the electron beam source and grounded by a fourth grounding point; and electron optic system provided in the column and controlling the electron beam; a power supply supplying voltage to the electron optic system and grounded by a fifth grounding point; wherein the electron beam source and the electron optic system are electrically insulated from the sample chamber, the column, the exhaust section and the stage, and a grounding point selected from a group including the first grounding point, the second grounding point and the third grounding point is different from either the fourth grounding point or the fifth grounding point.

According to a fourth aspect of the present invention, there is provided a method for manufacturing a semiconductor device, the method comprising drawing a pattern on film located above a semiconductor substrate using an electron beam apparatus comprising: a sample chamber; a column connected to the sample chamber; an exhaust section which controls a pressure in the sample chamber and the column; a stage stored in the sample chamber, a sample being placed above the stage; a stage controller driving the stage; a cylinder provided in the column and electrically insulated from the column; an electron beam source provided in the cylinder and emitting an electron beam to the sample; an electron beam source power supply supplying power to the electron beam source; electron optic system provided in the cylinder and controlling the electron beam; and a power supply supplying a voltage to the electron optic system.

BRIEF DESCRIPTION OF THE SEVERAL VIEWS OF THE DRAWING

FIG. 1 is a diagram schematically showing the configuration of an electronic beam drawing apparatus in accordance with a first embodiment;

DETAILED DESCRIPTION OF THE INVENTION

Figure 2:
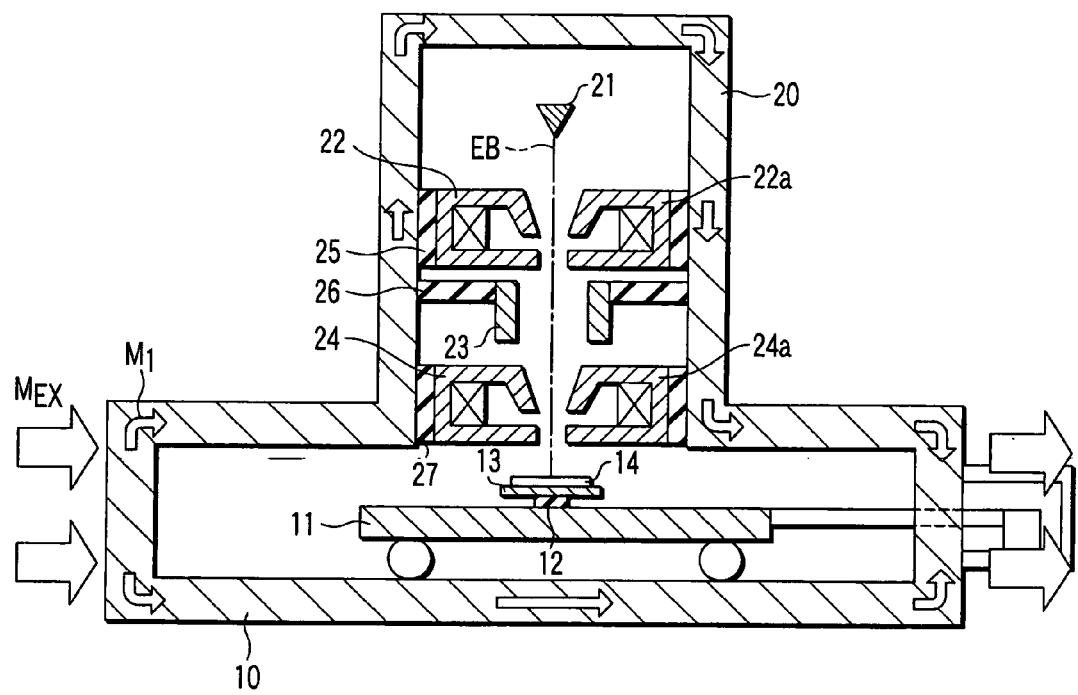
FIG. 2 is a diagram showing the flow of magnetic fluxes produced when magnetic disturbance reaches the electron beam drawing apparatus shown in FIG. 1.

Embodiments of the present invention will be described below with reference to the drawings.

First Embodiment

FIG. 1 is a diagram schematically showing the configuration of an electronic beam drawing apparatus in accordance with a first embodiment.

A column 20 is connected to a vacuum chamber (sample chamber) 10. Internal spaces in the vacuum chamber 10 and column 20 are connected together. The vacuum chamber 10 and the column 20 are made of a magnetic substance (for example, iron). The vacuum chamber 10 and the column 20 are electrically connected together. The vacuum chamber 10 is grounded by a D type earth $E_D$ via a grounding line.

A stage 11 is placed in the vacuum chamber 10. A stage controller 15 moves the stage controller 11 to a desired position by.

A sample holder 13 is installed on the stage 11 via a holder support 12 consisting of an insulating material such as ceramic. A sample 14 is installed on the sample holder 13. Thus, the sample 14 is insulated from the stage 11. The sample 14 is also insulated from the vacuum chamber 10 and column 20. The sample holder 13 is connected to an A type earth EA via a grounding line. The ground terminal of the stage controller 15 is grounded by the D type earth $E_D$.

The following are arranged in the column 20: an electron gun (electron beam source) 21, a condensing lens (electron optics system) 22, an electrostatic deflector (electron optics system) 23, and an objective (electron optics system) 24. The condensing lens 22 is fixed to the column 20 by a condensing lens support 25 consisting of an insulating material such as ceramic. The condensing lens support 25 magnetically and electrically insulates the condensing lens 22 from the column 20. The electrostatic deflector 23 is fixed to the column 20 by a deflector support 26 consisting of an insulating material such as ceramic. The deflector support 26 magnetically and electrically insulates the electrostatic deflector 23 from the column 20. The objective 24 is fixed to the column 20 by an objective support 27 consisting of an insulating material such as ceramic. The objective support 27 magnetically and electrically insulates the objective 24 from the column 20. Accordingly, the condensing lens 22, the electrostatic deflector 23, and the objective 24 are also insulated from the vacuum chamber 10 and from the stage 11.

The condensing lens 22, the electrostatic deflector 23, and the objective 24 are grounded by the A type earth $E_A$ via a grounding line. The A type earth $E_A$ offers a ground resistance of at most 10Ω. The D type earth $E_D$ offers a ground resistance of at most 100Ω.

The electron gun 21 is provided in the column 20 and emits an electron beam EB. The electron gun 21 is insulated from the column 20, vacuum chamber 10, and stage 11. The condensing lens 22 adjusts electron beam irradiation conditions. The electrostatic deflector 23 deflects the electron beam EB to control the position irradiated with the electron beam EB. Moreover, the objective 24 focuses the electron beam EB on the surface of the sample 14.

An electron gun power source 31 sets an acceleration voltage and a filament current to allow the electron gun 21 to emit an electron beam. The reference potential of the electron gun power supply 31 is grounded by the A type earth $E_A$.

The condensing lens 22 is composed of a magnetic pole 22a and a coil 22b. Similarly, the objective 24 is composed of a magnetic pole 24a and a coil 24b. The intensities of the condensing lens 22 and objective 24 are controlled in accordance with a current supplied to the coils 22b and 24b by a lens power supply (control power supply) 32. The reference potential of the lens power supply 33 is grounded by the A type earth $E_A$.

The electrostatic deflector 23 is composed of metal. The position to which the electron beam EB is deflected is controlled by a voltage applied to the electrostatic deflector 23 by the deflecting power supply (control power supply) 33. The reference potential of the deflecting power supply 32 is grounded by the A type earth $E_A$.

The vacuum chamber 10 and the column 20 are composed of a magnetic substance and constitute a boundary between the vacuum and atmosphere. A turbo molecular pump (exhaust section) 41 is connected to the vacuum chamber 10. A roots pump (MBP, exhaust section) 42 is connected to an exhaust side of the turbo molecular pump 41. The turbo molecular pump 41 and the roots pump (MBP, exhaust section) 42 subject the vacuum chamber 10 to vacuum pumping.

A vacuum gauge (exhaust section) 43 is connected to the vacuum chamber 10 and measures the pressure (degree of vacuum) in the vacuum chamber 10. The vacuum chamber 10 connects to a solenoid valve (exhaust section) 44 and pipe 45 which are required to set the pressure in the vacuum chamber 10 equal to atmospheric pressure.

A measurement signal from the vacuum gauge 43 is input to a vacuum controller 46. The vacuum controller (exhaust section) 46 controls the turbo molecular pump 41, the roots pump 42, and the solenoid valve 44. The reference potential of the vacuum controller 46 is grounded by the D type earth $E_D$ via a grounding line.

The turbo molecular pump 41, roots pump 42, vacuum gauge 43, solenoid valve 44, and vacuum controller 46 are electrically insulated from the electron gun 21, the condensing lens 22, electrostatic deflector 23, objective 24, and sample 14. As described above, the sections are insulated from one another, so that the group consisting of the electron gun 21, the condensing lens 22, electrostatic deflector 23, objective 24, and sample 14 is electrically insulated from the group consisting of the vacuum chamber 10, column 20, turbo molecular pump 41, roots pump 42, vacuum gauge 43, solenoid valve 44, vacuum controller 46, and stage 11.

Application of magnetic disturbance $M_{EX}$ will be described with reference to FIG. 2. As described above, the chamber 10 and the column 20 are made of a magnetic substance. Thus, when the magnetic disturbance $M_{EX}$ are applied to the chamber 10, a magnetic flux M1 flows through the chamber 10 and column 20, which offer a lower magnetic resistance than the surrounding space. The column 20 is magnetically insulated from the objective 23 and condensing lens 22. Consequently, the magnetic flux M1 flows only through the column 20 rather than flowing from the column 20 to the magnetic poles 22a and 24b. Thus, the magnetic flux M1 flowing through the magnetic poles 22a and 24b does not degrade the ability to control the electron beam EB.

The vacuum chamber 10 connects to the turbo molecular pump 41, roots pump 42, vacuum gauge 43, the stage controller 15, and solenoid valve 44. Electric noise is made by the turbo molecular pump 41, roots pump 42, vacuum gauge 43, solenoid valve 44, and stage controller 15 (collectively referred to as first group apparatuses): The electric noise is transmitted through the chamber 10 and into the D type earth $E_D$.

The reference potential of the electron gun power supply 31, deflecting power supply 32, and lens power supply 33 (collectively referred to as second group apparatuses), which control electron beam EB, is grounded by the A type earth EA, which is different from the earth to which the first group apparatuses, making noise, are connected. Consequently, the reference potential of the second group apparatus is not affected by noise from the first group apparatuses.

The potential of the D type earth ED is varied by noise generated by, for example, the roots pump 42. However, this potential does not directly affect the electron beam EB.

Further, the reference potential of the second group apparatuses, which control the electron beam EB, is grounded by the A type earth $E_A$. The first group apparatuses such as the roots pump 42 are grounded by the D type earth $E_D$. Thus, even if the potential of the D type earth $E_D$ is varied by noise generated by any of the first group apparatuses, for example, the roots pump 42, the variation does not affect the second group apparatuses.

The present configuration provides a vacuum chamber that makes it possible to block electromagnetic disturbance and to prevent the entry of noise from the apparatuses (first group apparatuses) connected to the vacuum chamber. As a result, the ability to control the electron beam EB can be improved.

Figure 3:
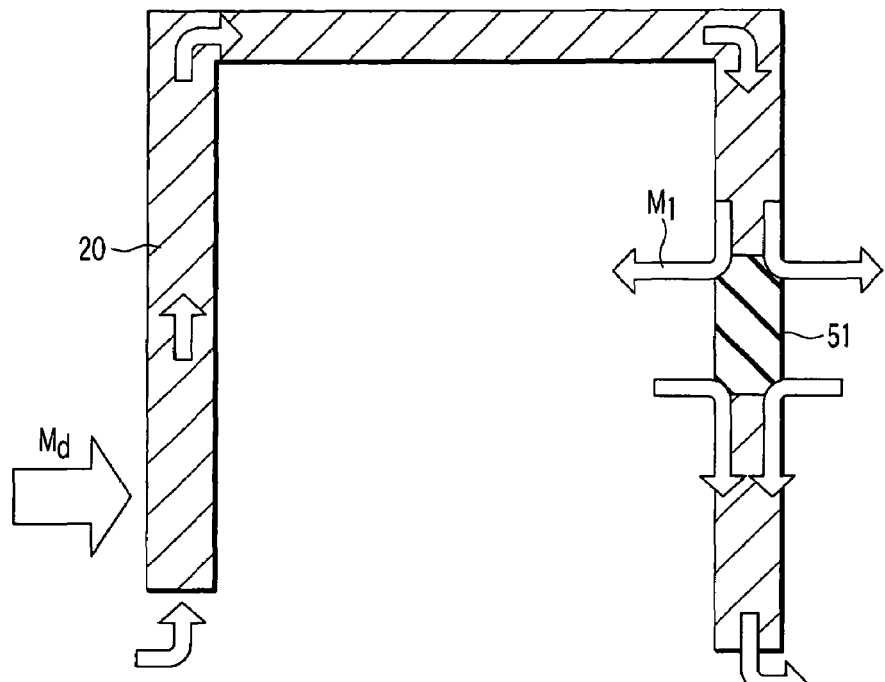
FIG. 3 is a diagram showing the flow of magnetic fluxes produced when a nonmagnetic opening is formed in a magnetic path in the electron beam drawing apparatus shown in FIG. 1.

Further, as shown in FIG. 3, a magnetic opening may be formed in the middle of a magnetic path constituting the column 20; the magnetic opening is a nonmagnetic substance, for example, a feed-through 51 used to apply a voltage to an electric pole. In this case, the magnetic flux M1 generated near the feed-through 51 by magnetic disturbance $M_d$ leaks across the optical axis of the electron beam EB to degrade the positional accuracy of the electron beam.

Figure 4:
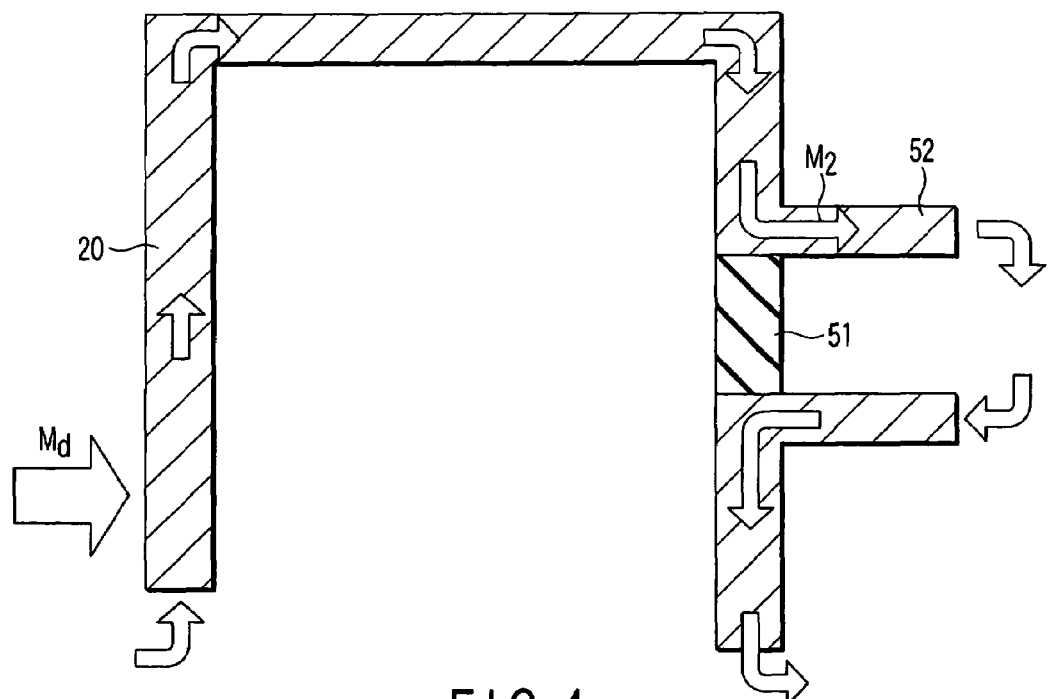
FIG. 4 is a diagram showing the flow of magnetic fluxes produced if a chimney-like magnetic substance is provided at the nonmagnetic opening in accordance with the first embodiment.

To suppress the degradation of positional accuracy of the electron beam EB, a chimney-like shield portion (projecting portion) 52 may be provided opposite the optical axis as shown in FIG. 4. The shield portion 52 consists of a magnetic substance. Such a configuration allows a magnetic flux $M_2$ located near the feed-through 51 after having flowed through the column 20 to pass through the shield portion 52. The magnetic flux $M_2$ then leaks in a direction opposite to the optical axis. Accordingly, the optical axis is not affected. If the opening is rectangular, the height of the shield portion 52 may be at least twice as large as the length of a short side of the opening. If the opening is elliptical, the height of the shield portion 52 may be at least twice as large as the minor axis of the opening.

Second Embodiment

Figure 5:
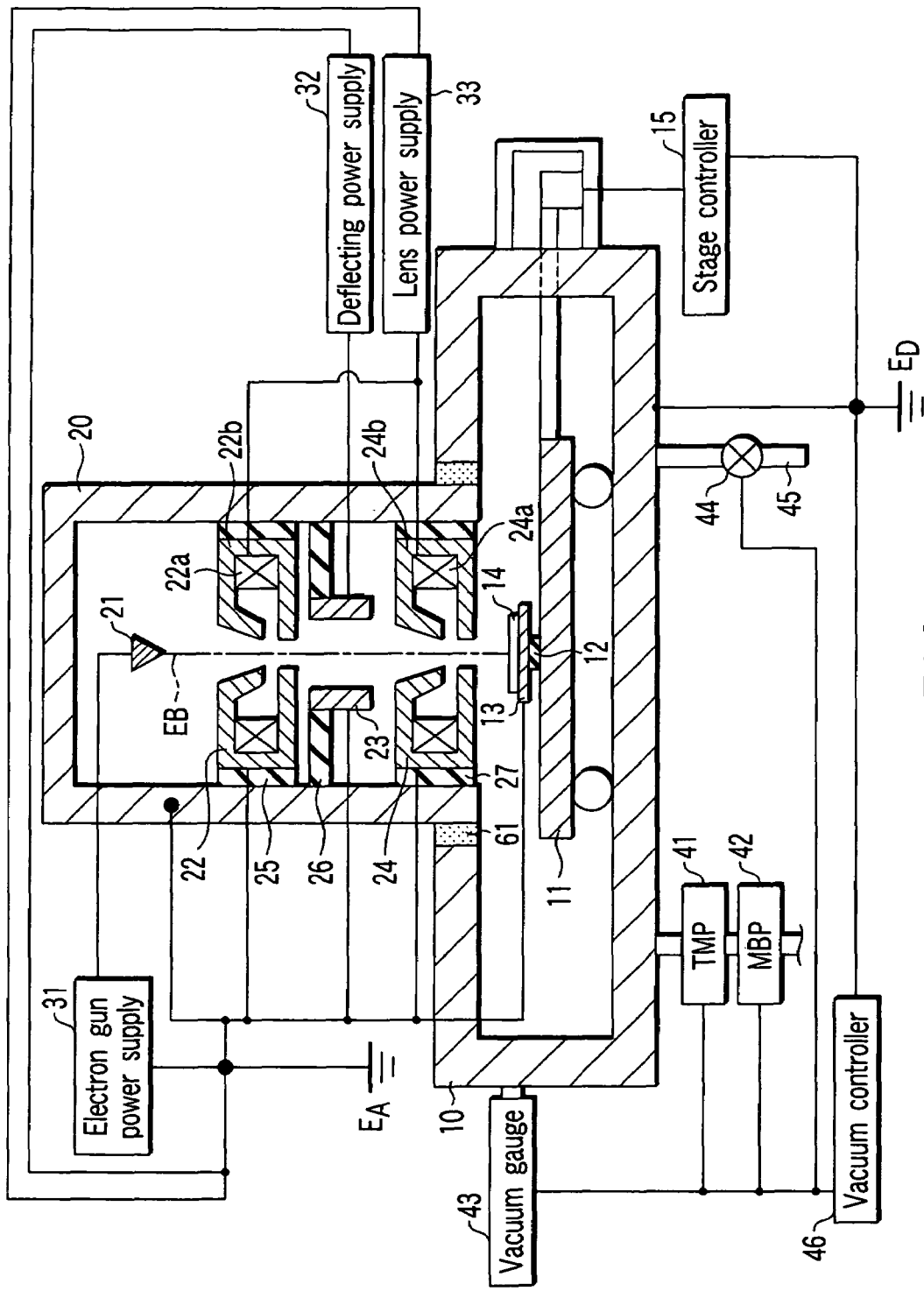
FIG. 5 is a diagram schematically showing the configuration of an electronic beam drawing apparatus in accordance with a second embodiment.

FIG. 5 is a diagram schematically showing the configuration of an electronic beam drawing apparatus in accordance with a second embodiment. In FIG. 5, the same components as those in FIG. 1 have the same reference numerals and will not be described below.

The chamber 10 and the column 20 are joined together via a ferrite (junction) 61. In the first embodiment, the column 20, which consists a magnetic substance, is electrically coupled to the chamber 10. Accordingly, a noise current from the chamber 10 is likely to flow into the column 20. High-frequency noise propagates through a vacuum and reaches the condensing lens 22, electrostatic deflector 23, objective 24, and the like More specifically, the high-frequency noise is superimposed on voltage application lines from the deflecting power supply 32 and lens power supply 43. As a result, the control of the electron beam EB is affected. To prevent this, the ferrite 61 is placed at the junction between the chamber 10 and the column 20.

The column 20 is grounded by the A type earth $E_A$. The chamber 10 is grounded by the D type earth $E_D$ as in the case of the first embodiment.

The ferrite 61 has a high magnetic permeability and a high volume resistivity. Electric noise flowing through the chamber 10 does not pass through the ferrite 61, having the high volume resistivity. Consequently, almost no electric noise flows through the column 20. A high-resistance magnetic substance different from the ferrite may be sandwiched between the chamber 10 and the column 20.

Figure 6:
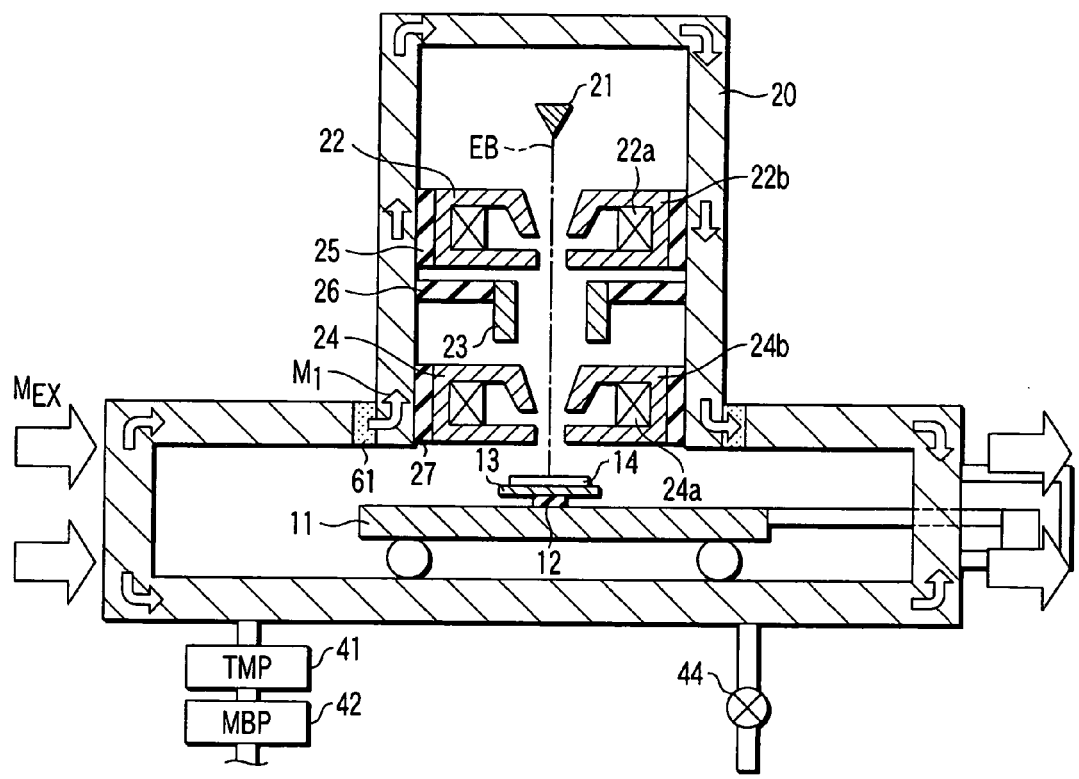
FIG. 6 is a diagram showing the flow of magnetic fluxes produced when magnetic disturbance is applied to the electron beam drawing apparatus shown in FIG. 5.

Further, since the ferrite 61 has the high magnetic permeability, the magnetic flux M1 flows through the ferrite 61 and into the column 20, composed of a magnetic substance, as shown in FIG. 6. Then, as in the case of the first embodiment, the magnetic flux M1 does not flow from the column 20 to the magnetic pole 22a or 24b. Thus, even the application of magnetic disturbance is prevented from degrading the ability to control the electron beam EB as in the case of the first embodiment.

This configuration not only produces the effects of the first embodiment but also enables a reduction in electric noise flowing through the column 20. It is thus possible to reduce electric noise flowing from the column 20 to the condensing lens 22, electrostatic deflector 23, objective 24, and the like. This makes it possible to improve the ability to control the electron beam.

If there is an opening in the magnetic path through which the magnetic flux travels, a chimney-like shield portion may be provided which consists of a magnetic substance.

Third Embodiment

Figure 7:
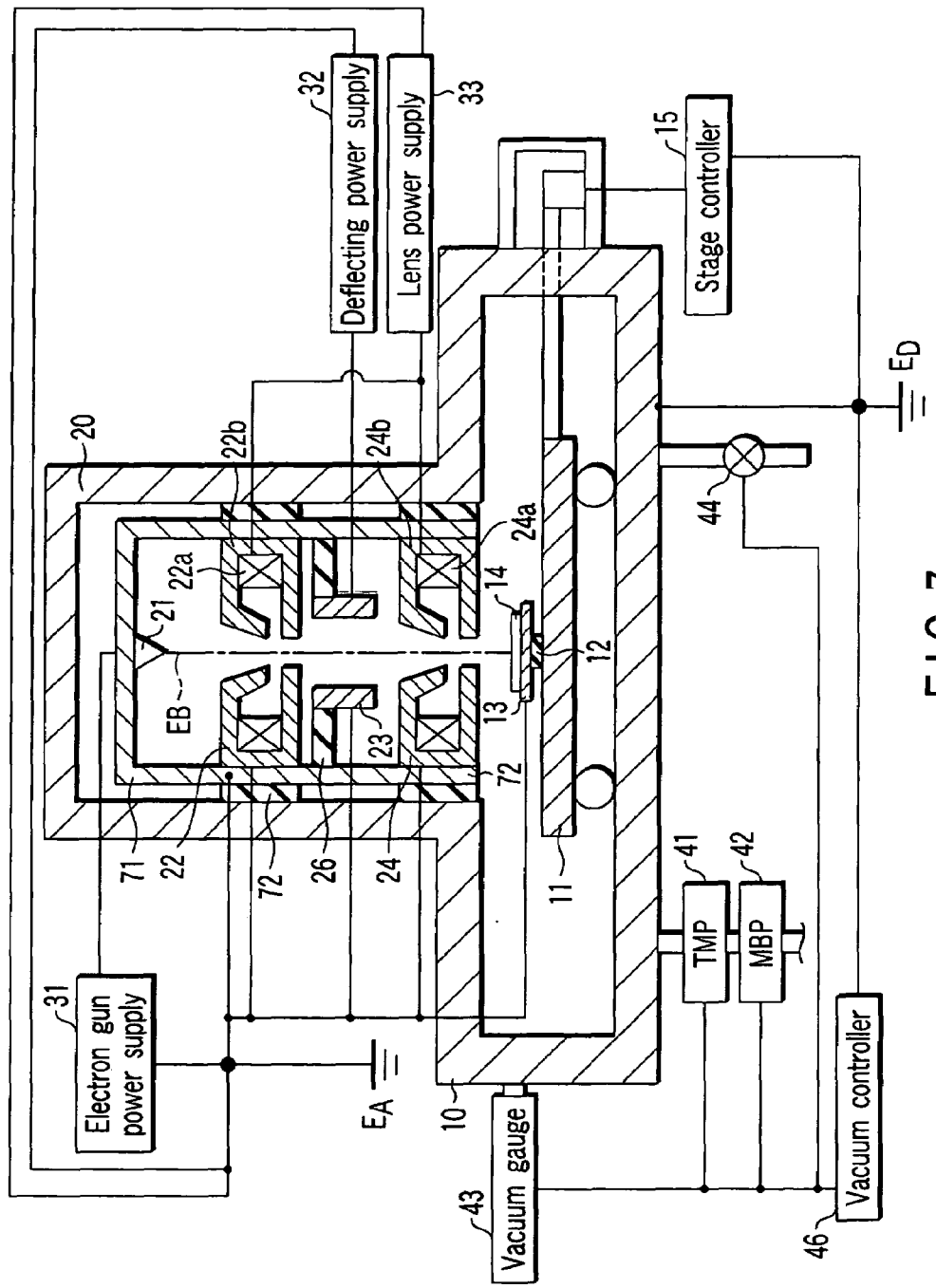
FIG. 7 is a diagram schematically showing the configuration of an electronic beam drawing apparatus in accordance with a third embodiment.

FIG. 7 is a diagram schematically showing the configuration of an electronic beam drawing apparatus in accordance with a third embodiment.

An internal cylinder 71 composed of a conductor is provided in the column 20. The internal cylinder 71 is fixed to the column 20 using an insulating support 72. Accordingly, the internal cylinder 71 is electrically insulated from the column 20 and chamber 10. The condensing lens 22 and the objective 24 are fixed to the internal cylinder 71. The electrostatic deflector 23 is fixed to the internal cylinder 71 using the deflector support 26. The electron gun 21 is fixed to the internal cylinder 71.

The internal cylinder 71 is grounded by the independent A type earth $E_A$. The chamber 10 is grounded by the D type earth $E_D$. The chamber 10 also controls the electron beam EB. The electron gun power source 31, deflecting power supply 32, and lens power supply 33 are grounded by the A type earth $E_A$ in order to obtain the reference potential.

The stage controller 15 and the vacuum controller 46 are grounded by the D type earth $E_D$ in order to obtain the reference potential. The chamber 10 configured as described above will be described below.

In the electron beam apparatus shown in FIG. 1, the assembly accuracy of the condensing lens 22, electrostatic deflector 23, and objective 24 depends greatly on the machining accuracy of the column 20. However, the assembly accuracy of the condensing lens 22, electrostatic deflector 23, and objective 24 configured in accordance with the present embodiment does not depend on the machining accuracy of the column 20 but on the machining accuracy of the internal cylinder 71. The internal cylinder 71 is smaller than the column 20 and can thus be machined more easily than the column 20. Accordingly, the machining accuracy of the internal cylinder 71 can be improved. In particular, the condensing lens 22 and objective 24 configured to be of an electrostatic type are lighter and smaller. This also makes it possible to reduce the size of the internal cylinder 71. Thus, more accurate assembly can be accomplished.

The present configuration not only produces the effects of the first embodiment but also prevents electric noise from the apparatuses (first group apparatuses) connected to the vacuum chamber 10 from reaching the condensing lens 22, electrostatic deflector 23, objective 24, and the like via the column 20. It is also possible to improve the assembly accuracy of the condensing lens 22, electrostatic deflector 23, and objective 24 and thus the ability to control the electron beam EB.

If an opening is formed in the magnetic path through which a magnetic flux travels, arrangements similar to those in the first embodiments may be used. Further, as in the second embodiment, a high-resistance magnetic substance may be provided between the chamber 10 and the column 20.

Other Embodiments

Figure 8:
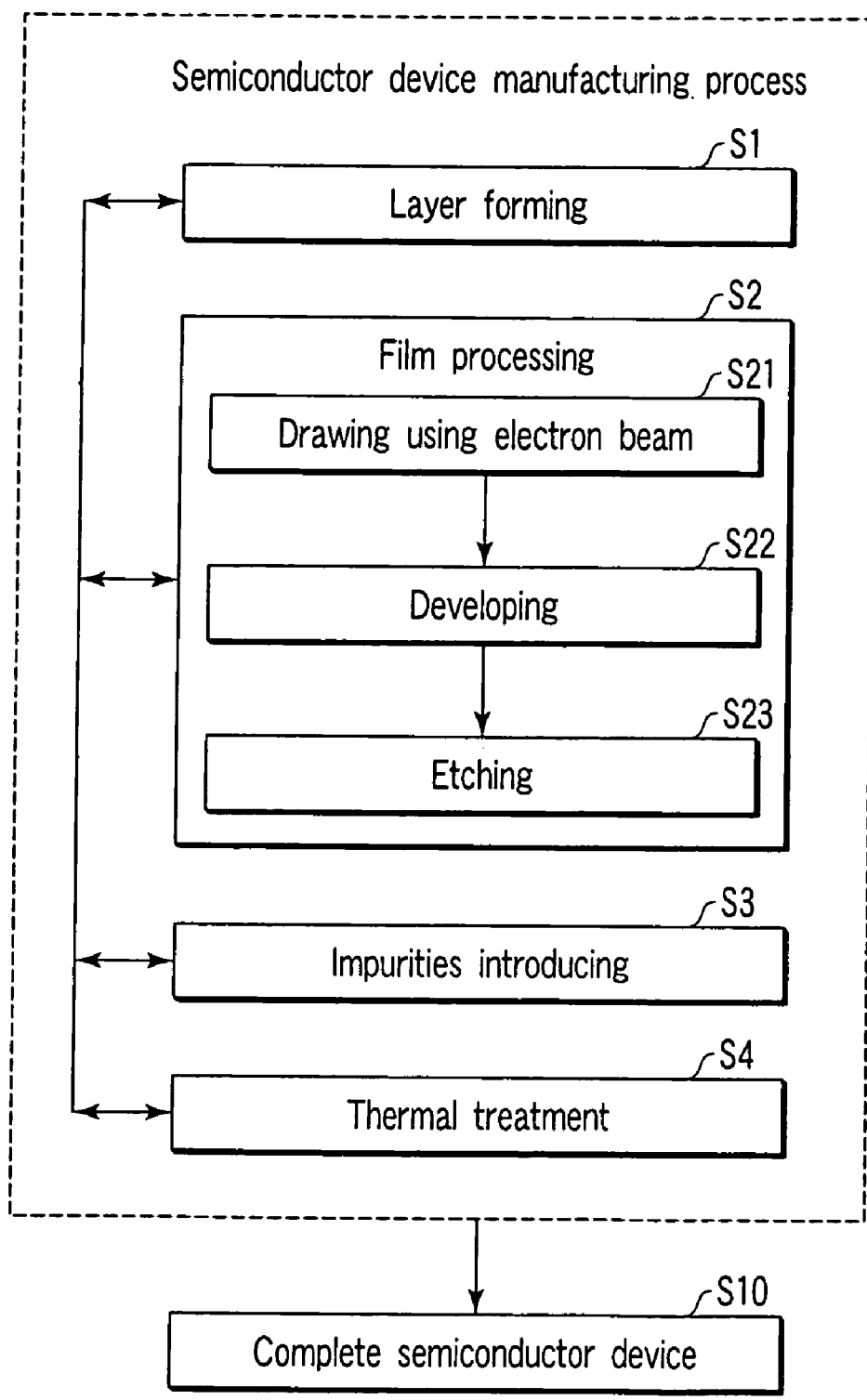
FIG. 8 is a flowchart of a process for manufacturing a semiconductor device using the electron beam drawing apparatuses in accordance with any of the first to third embodiments.

A semiconductor device is manufactured by irradiating a process-target substrate as the sample 14 with an electron beam using the electron beam drawing apparatus in accordance with any of the first to third embodiments. That is, as shown in FIG. 8, a semiconductor manufacturing process involves executing various known semiconductor manufacturing steps at predetermined stages a predetermined number of times, the steps including layer formation (step S1), film process (step S2), impurity introduction (step S3), and thermal treatment (step S4). As a result, a semiconductor device is formed (step S10).

In the film process, the electron beam drawing apparatus in accordance with any of the embodiments is used. That is, first, in the film formation, an insulating film or conductive film (target film) to be processed is formed on a semiconductor substrate. A resist film is then formed on the target film. Then, the electron beam drawing apparatus is used to irradiate the resist film with an electron beam so as to draw a pattern corresponding to a desired shape of the target film (step S21). Then, the resist film is developed (step S22) to form a pattern with desired openings on the resist film. Then, the target film is etched by anisotropic etching such as reactive ion etching (RIE) using the resist film as a mask (step 23). As a result, the target film is processed into a desired pattern.

The present invention is not limited to the above embodiments. The above configurations are also applicable to, for example, a transmission electron microscope, or a scanning electron microscope.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An electron beam apparatus comprising:
   a sampled chamber grounded by a first grounding point and comprising a magnetic substance;
   a column connected to the sample chamber and comprising a magnetic substance;
   an exhaust section controlling a pressure in the sample chamber and a pressure in the column and grounded by a second grounding point;
   a stage provided in the sample chamber, a sample being placed above the stage;
   a stage controller driving the stage and grounded by a third grounding point;
   an electron beam source provided in the column and emitting an electron beam to the sample;
   an electron beam source power supply supplying power to the electron beam source and grounded by a fourth grounding point;
   an electron optic system provided in the column and controlling the electron beam; and
   a power supply supplying voltage to the electron optic system and grounded by a fifth grounding point;

wherein the electron beam source and the electron optic system are electrically insulated from the sample chamber, the column, the exhaust section and the stage, and a grounding point selected from a group including the first grounding point, the second grounding point and the third grounding point is different from either the fourth grounding point or the fifth grounding point.

2. The apparatus according to claim 1, wherein the first grounding point, the second grounding point and the third grounding point have almost a same ground resistance value, and the fourth grounding point and the fifth grounding point have almost a same ground resistance value.

3. The apparatus according to claim 1, wherein ground resistance values of the first grounding point, the second grounding point and the third grounding point are almost as same as a first value, and ground resistance values of the fourth grounding point and the fifth grounding point are almost as same as a second value which is smaller than the first value.

4. The apparatus according to claim 1, further comprising a support joining the electron optic system and the column between the electron optic system and the column and electrically and magnetically insulating the electron optic system from the column.

5. The apparatus according to claim 1, further comprising a holder provided above the stage, insulated from the stage and grounded by a sixth grounding point, a sample being placed on the holder, wherein the electron optic system is grounded by a seventh grounding point, and the sixth grounding point and the seventh grounding point have almost a same ground resistance value as that of the fourth grounding point and the fifth grounding point.

6. The apparatus according to claim 5, wherein the first grounding point, the second grounding point and the third grounding point have almost a same ground resistance value, and the fourth grounding point, the fifth grounding point, the sixth grounding point and the seventh grounding point have almost a same ground resistance value.

7. The apparatus according to claim 5, wherein ground resistance values of the first grounding point, the second grounding point and the third grounding point are almost as same as a first value, and ground resistance values of the fourth grounding point, the fifth grounding point, the sixth grounding point and the seventh grounding point are almost as same as a second value which is smaller than the first value.

8. The apparatus according to claim 1, wherein the column includes a nonmagnetic substance, and a projecting portion located adjacent to the nonmagnetic substance, comprising a magnetic substance and projecting out from the column.

9. The apparatus according to claim 1, further comprising a joining portion joining the sample chamber and the column between the sample chamber and the column and having a volume resistivity higher that that of a material constituting the sample chamber and the column, wherein the column is grounded by a sixth grounding point.

10. The apparatus according to claim 9, wherein the first grounding point, the second grounding point and the third grounding point have almost a same ground resistance value, and the fourth grounding point, the fifth grounding point and the sixth grounding point have almost a same ground resistance value.

11. The apparatus according to claim 9, wherein ground resistance values of the first grounding point, the second grounding point and the third grounding point are almost as same as a first value, and ground resistance values of the fourth grounding point, the fifth grounding point and the sixth grounding point are almost as same as a second value which is smaller than the first value.

12. The apparatus according to claim 1, further comprising a cylinder provided in the column, electrically insulated from the column, comprising a conductor, and grounded by a sixth grounding point, the electron beam source and the electron optic system being attached to the cylinder.

13. The apparatus according to claim 12, wherein the first grounding point, the second grounding point and the third grounding point have almost a same ground resistance value, and the fourth grounding point, the fifth grounding point and the sixth grounding point have almost a same ground resistance value.

14. The apparatus according to claim 12, wherein ground resistance values of the first grounding point, the second grounding point and the third grounding point are almost as same as a first value, and ground resistance values of the fourth grounding point, the fifth grounding point and the sixth grounding point are almost as same as a second value which is smaller than the first value.

15. A method for manufacturing a semiconductor device, the method comprising drawing a pattern on film located above a semiconductor substrate using an electron beam apparatus comprising:

a sample chamber grounded by a first grounding point and comprising a magnetic substance;

a column connected to the sample chamber and comprising a magnetic substance;

an exhaust section controlling a pressure in the sample chamber and a pressure in the column and grounded by a second grounding point;

a stage provided in the sample chamber, a sample being placed above the stage;

a stage controller driving the stage and grounded by a third grounding point;

an electron beam source emitting an electron beam to the sample;

an electron beam source power supply supplying power to the electron beam source and grounded by a fourth grounding point;

an electron optic system provided in the column and controlling the electron beam; and a power supply supplying voltage to the electron optic system and grounded by a fifth grounding point;

wherein the electron beam source and the electron optic system are electrically insulated from the sample chamber, the column, the exhaust section and the stage, and a grounding point selecting from a group including the first grounding point, the second grounding point and the third grounding point is different from either the fourth grounding point or the fifth grounding point.

16. A method for manufacturing a semiconductor device, the method comprising drawing a pattern on film located above a semiconductor substrate using an electron beam apparatus comprising:

a sample chamber grounded by a first grounding point and comprising a magnetic substance;

a column connected to the sample chamber and comprising a magnetic substance;

an exhaust section which controls a pressure in the sample chamber and a pressure in the column and grounded by a second grounding point;

a stage provided in the sample chamber, a sample being placed above the stage;

a stage controller driving the stage and grounded by a third grounding point;

a cylinder provided in the column, electrically insulated from the column, comprising a conductor, and grounded by a fourth grounding point;

an electron beam source provided in the cylinder and emitting an electron beam to the sample;

an electron beam source power supply supplying power to the electron beam source and grounded by a fifth grounding point;

an electron optic system provided in the cylinder and controlling the electron beam; and a power supply supplying a voltage to the electron optic system and grounded by a sixth grounding point, wherein the electron beam source and the electron optic system are electrically insulated from the sample chamber, the column, the exhaust section, the stage and the cylinder, and a grounding point selected from a group including the first grounding point, the second grounding point and the third grounding point is different from one of the fourth grounding point, the firth grounding point and the sixth grounding point.

* * * * *

UNITED STATES PATENT AND TRADEMARK OFFICE
CERTIFICATE OF CORRECTION

PATENT NO.        : 7,372,027 B2
APPLICATION NO. : 11/247263
DATED             : May 13, 2008
INVENTOR(S)      : Atsushi Ando et al.

It is certified that error appears in the above-identified patent and that said Letters Patent is hereby corrected as shown below:

In claim 16, column 12, line 15, "firth" should read -- fifth --.

Signed and Sealed this

Fifth Day of August, 2008

JON W. DUDAS
*Director of the United States Patent and Trademark Office*